United States Patent
Zhang et al.

(10) Patent No.: US 7,646,568 B2
(45) Date of Patent: Jan. 12, 2010

(54) ULTRA THIN SEED LAYER FOR CPP OR TMR STRUCTURE

(75) Inventors: Kunliang Zhang, Milpitas, CA (US); Hui-Chuan Wang, Pleasanton, CA (US); Tong Zhao, Fremont, CA (US); Yu-Hsia Chen, Mountain View, CA (US); Min Li, Dublin, CA (US); Cherng-Chyi Han, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 669 days.

(21) Appl. No.: 11/317,598

(22) Filed: Dec. 23, 2005

(65) Prior Publication Data

US 2007/0146928 A1  Jun. 28, 2007

(51) Int. Cl.
G11B 5/127 (2006.01)
(52) U.S. Cl. ................................. 360/324.11
(58) Field of Classification Search ............ 360/324.11, 360/324.1, 324.2, 324.12
See application file for complete search history.

(56) References Cited

U.S. PATENT DOCUMENTS

| | | | | |
|---|---|---|---|---|
| 6,222,707 B1 * | 4/2001 | Huai et al. | ........... | 360/324.1 |
| 6,806,804 B2 | 10/2004 | Saito et al. | ........... | 336/200 |
| 6,862,158 B2 | 3/2005 | Hasegawa et al. | ...... | 360/324.11 |
| 6,862,159 B2 | 3/2005 | Hasegawa | ........... | 360/324.11 |
| 6,903,904 B2 | 6/2005 | Li et al. | ........... | 360/324.11 |
| 6,919,594 B2 | 7/2005 | Sharma et al. | ........... | 257/295 |
| 6,936,903 B2 | 8/2005 | Anthony et al. | ........... | 257/422 |
| 7,331,100 B2 * | 2/2008 | Li et al. | ........... | 29/603.14 |
| 2004/0179311 A1 | 9/2004 | Li et al. | ........... | 360/324.12 |
| 2005/0164414 A1 | 7/2005 | Deak | ........... | 438/3 |
| 2005/0174702 A1 | 8/2005 | Gill | ........... | 360/324.2 |
| 2006/0007605 A1 * | 1/2006 | Li et al. | ........... | 360/324.1 |
| 2006/0044704 A1 * | 3/2006 | Li et al. | ........... | 360/324.11 |
| 2007/0217085 A1 * | 9/2007 | Gill | ........... | 360/324.12 |
| 2008/0112089 A1 * | 5/2008 | Li et al. | ........... | 360/324 |

OTHER PUBLICATIONS

Co-pending U.S. Patent App. HT-03-043, U.S. Appl. No. 10/886,288, filed Jul. 7, 2004, assigned to the same assignee as the present invention, "Improved Seed/AFM Combination for CPP GMR Device".
Co-pending U.S. Patent App. HT-04-042, U.S. Appl. No. 10/977,636, filed Oct. 29, 2004, assigned to the same assignee as the present invention, "Improved AP1 Layer for TMR Device".
Co-pending U.S. Patent HT-05-015, U.S. Appl. No. 11/180,808, filed Jul. 13, 2005, Assigned to the same assignee as the present invention, "CPP Structure with Enhanced GMR Ratio".

* cited by examiner

*Primary Examiner*—Allen T Cao
(74) *Attorney, Agent, or Firm*—Saile Ackerman LLC; Stephen B. Ackerman

(57) ABSTRACT

Improved magnetic devices have been fabricated by replacing the conventional seed layer (typically Ta) with a bilayer of Ru on Ta. Although both Ru and Ta layers are ultra thin (between 5 and 20 Angstroms), good exchange bias between the seed and the AFM layer (IrMn about 70 Angstroms thick) is retained. This arrangement facilitates minimum shield-to-shield spacing and gives excellent performance in CPP, CCP-CPP, or TMR configurations.

16 Claims, 1 Drawing Sheet

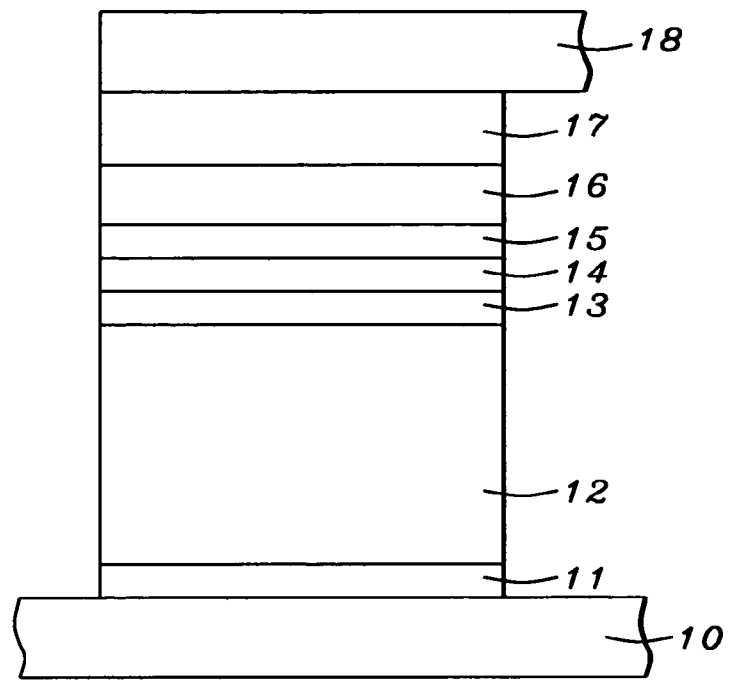
FIG. 1 - Prior Art
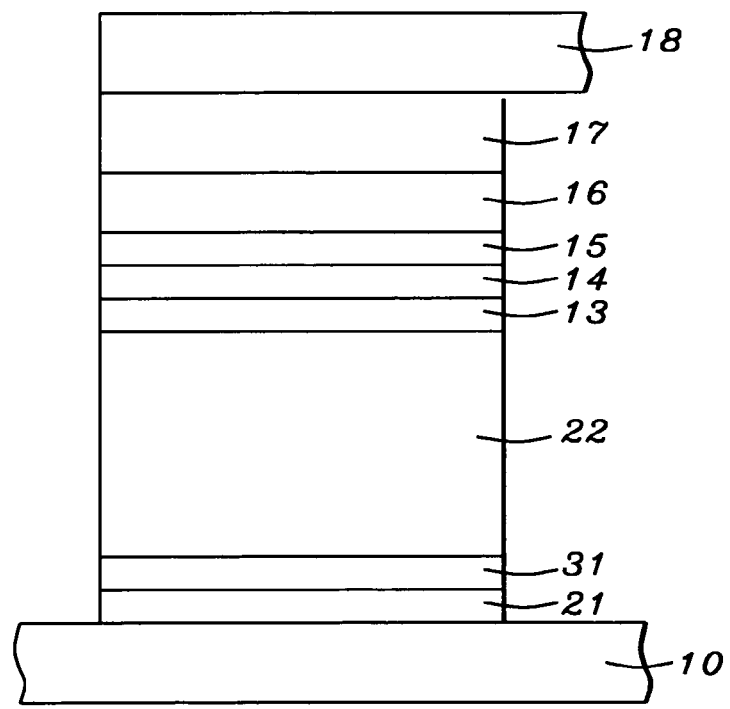
FIG. 2

ULTRA THIN SEED LAYER FOR CPP OR TMR STRUCTURE

Related application HT03-043 (file Ser. No. 10/886,288 filed on Jul. 7, 2004) discloses an ultra thin seed layer based on Ta/NiCr. It is herein incorporated, by reference, in its entirety.

FIELD OF THE INVENTION

The invention relates to the general field of magnetic read heads with particular reference to very thin seed layers for the AP2 pinning layer.

BACKGROUND OF THE INVENTION

The principle governing the operation of most magnetic read heads is the change of resistivity of certain materials in the presence of a magnetic field (magneto-resistance or MR). Magneto-resistance can be significantly increased by means of a structure known as a spin valve where the resistance increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are illustrated in FIG. 1. They are lower magnetic shield 10 on which is seed layer 11. Antiferromagnetic (AFM) layer 12 is on seed layer 11. Its purpose is to act as a pinning agent for a magnetically pinned layer. The latter is typically a synthetic antiferromagnet formed by sandwiching antiferromagnetic coupling layer 14 between two antiparallel ferromagnetic layers 13 (AP2) and 15 (AP1).

Next is a copper spacer layer 16 on which is low coercivity (free) ferromagnetic layer 17. Capping layer 18 lies atop free layer 17. When free layer 17 is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field.

If the direction of the pinned field is parallel to the free layer, electrons passing between the free and pinned layers suffer less scattering. Thus, the resistance in this state is lower. If, however, the magnetization of the pinned layer is anti-parallel to that of the free layer, electrons moving from one layer into the other will suffer more scattering so the resistance of the structure will increase. The change in resistance of a spin valve is typically 10-20%.

Earlier GMR devices were designed to measure the resistance of the free layer for current flowing parallel to its two surfaces. However, as the quest for ever greater densities has progressed, devices that measure current flowing perpendicular to the plane (CPP) have also emerged.

Another consideration is the R.A product. This is the resistance of the CPP device times its cross-sectional area. Normally, the transverse resistance of a layer increases as its cross-sectional area decreases so the R.A product tends to be a constant. However, by arranging for the current path to be confined to only certain parts of the free layer, a larger value for R.A can be achieved. Devices of this type are referred to as CCP (confined current path) devices.

If copper spacer layer 16 in FIG. 1 is replaced by a very thin layer of insulating material, a magnetic tunneling junction (MTJ) device that depends on the TMR (tunneling magneto resistance) effect is formed. In this device, the tunneling current that passes through layer 16 (when it is an insulator) from layer 15 to layer 17, is measurably larger when the directions of magnetization of layers 15 and 17 are parallel (as opposed to antiparallel).

Typically, in both TMR and CPP-GMR head structures, a bottom synthetic spin valve type film stack has been employed for biasing reasons, together with a Ta—NiCr based seed layer for the AFM and a CoFe/NiFe composite free layer.

In a typical TMR or CPP spin valve structure of any case shown above, the conventional seed layer thickness of Ta/NiCr is about 70 Å, and the AP1 or AP2 thickness is in the range of 20-50 Å, and the free layer thickness is in the range of 30-60 Å. For ultra-high density read head applications, a thinner total film stack thickness is preferred in order to achieve higher resolution. Since reducing the magnetic layer thickness also reduces the MR ratio of TMR or CPP, it would be preferable to reduce the thickness of the nonmagnetic layers. The present invention provides a solution to this problem.

A routine search of the prior art was performed with the following references of interest being found:

U.S. Patent Application 2004/0179311 (Lin et al) Headway states that Ta and NiCr form a typical seed layer. U.S. Pat. No. 6,936,903 (Anthony et al) and U.S. Pat. No. 6,919,594 (Sharma et al) both make reference to seed layers of Ta/Ru. but neither invention gives details concerning their thicknesses. Nor do they specify that these may be used with a pinning layer of IrMn of the thickness taught by the present invention.

U.S. Patent Application 2005/0164414 (Desk) teaches that the seed layer may be NiFe, Cu, or other materials and have a thickness of 5 to 50 Angstroms. U.S. Patent Application 2005/0174702 (Gill) describes a seed layer comprising 30 Angstroms of Ta and 20 Angstroms of NiFeCr. U.S. Pat. No. 6,903,904 (Li et al) Headway discloses a seed layer of Ta/NiFe of 30-70 Angstroms.

U.S. Pat. No. 6,806,804 (Saito et al) teaches a 30 Angstrom NiFe seed layer over a Ta underlayer. U.S. Pat. No. 6,862,159 (Hasegawa) shows a Ta/Cr or Ta/NiFe seed layer where the Cr or NiFe layer is 30 Angstroms thick. Finally, U.S. Pat. No. 6,862,158 (Hasegawa et al) teaches a Ta/Cr seed layer formed using Ar gas wherein the Cr layer is 15-50 Angstroms. It is stated that under 15 Angstroms, the Cr layer is not uniform.

SUMMARY OF THE INVENTION

It has been an object of at least one embodiment of the present invention to provide a magnetic read head having improved performance together with improved spatial resolution.

A further object of at least one embodiment of the present invention has been to provide a process for manufacturing said read head.

Another object of at least one embodiment of the present invention has been to reduce total device thickness by reducing the thickness of the non-magnetic layers.

Yet another object of at least one embodiment of the present invention has been to reduce seed layer thickness without significantly reducing the exchange bias between the pinning and pinned layers.

Still another object of at least one embodiment of the present invention has been that said process be compatible with existing processes for the manufacture of CPP GMR, CCP GMR, and TMR devices.

These objects have been achieved by replacing the conventional seed layer (typically Ta) with a bilayer of Ru on Ta, said seed being deposited on the NiFe layer that constitutes the lower magnetic shield. Additional improvement is obtained if the conventional non-magnetic spacer layer of copper is replaced by (1) a sandwich structure of two copper layers with an NOL (nano-oxide layer) between them, and (2) a thin insulating layer. With the ultra-thin Ta/Ru seed layer disclosed by the present invention, we are able to achieve a higher MR ratio, better exchange bias field, and thinner total film stack thickness, which are all desirable for ultra high density recording heads.

The thickness of the Ta layer ranges from 5 Å to 20 Å, and the thickness of the Ru layer is from 5 Å to 20 Å. Both Ta and Ru layers can be processed either using Ar gas or Kr gas. Although Ru is our preferred material for contacting the AFM layer, other materials such as Cu, Ni, NiFe, CoFe or Cr could be used in a similar thickness range.

BRIEF DESCRIPTION OF THE DRAWINGS

FIG. 1 shows a GMR stack of the prior art which has a conventional seed layer

FIG. 2 shows a GMR stack according to the teachings of the present invention, including an improved seed layer.

DESCRIPTION OF THE PREFERRED EMBODIMENTS

It is desirable for a CPP spin valve structure to have a thin seed layer and a thin AFM layer so as to reduce shield to shield spacing; this makes possible a thicker AP1/AP2 which gives a better CPP GMR ratio. This requires better Hex (exchange coupling between AP2 and AFM layers). Previously, Ta50/Ru20/PtMn was used. The resulting thickness of the seed layer and AFM is undesirably large for high density applications. Also, the reliability of Ta/Ru/PtMn type spin valves, which are used in CIP-GMR heads, is a concern. The present invention overcomes these difficulties by using a Ta/Ru/IrMn70 structure (as compared to Ta/NiCr/IrMn70).

We now disclose the present invention through a description of the process for its manufacture. Referring now to FIG. 2, the process begins with the provision of lower shield layer 10 whose upper surface is then cleaned through plasma etching using argon flowing at a rate of about 30 SCCM at a power level of about 50 W for about 10 minutes, followed by the deposition of tantalum layer 21, between about 5 and 20 Angstroms thick, on this cleaned surface. Next, layer 31, about 20 Angstroms thick, is deposited onto tantalum layer 21. Our preferred material for layer 31 has been Ru but any of several other materials such as Cu, Ni, NiFe, CoFe, or Cr could also have been used. Layers 21 and 31, together, now form the seed layer.

Once this seed layer has been formed, as described above, layer 22 of IrMn is deposited thereon to a thickness between 40 and 80 Angstroms. This is followed by the formation of the pinned layer—AP2 layer 13 is deposited on the IrMn layer, followed by AFM coupling layer 14 and then by AP1 layer 15.

Next is the deposition of the non-magnetic spacer layer. In a first embodiment, layer 16 is copper. In a second embodiment, layer 16 includes a nano-oxide layer that is not continuous so that the copper that connects layers 15 and 17 is confined to pass through only the pin holes in the nano-oxide layer. In a third embodiment, layer 16 is a layer of insulating material and the device is a MTJ.

The process concludes with the deposition of free layer 17 (of a material such as CoFe, CoFe/NiFe, or [CoFeCu]$_2$/CoFe to a thickness between about 15 and 60 Angstroms) onto layer 34 followed by the formation, on free layer 17, of capping layer 18 (of a material such as Cu/Ta, CuRu, or Cu/Ru/Ta/Ru.

Confirmatory Results

Shown in TABLE I are the exchange bias comparisons between Ta/NiCr seed layers and Ta/Ru seed layers. The full stack structure for both was:

seed/IrMn70/CoFe(25%)20/Ru10/Ta50  (Ru10/Ta50 being the capping layer).

TABLE I

| SEED | Hex | Hc | Hex/Hc |
| --- | --- | --- | --- |
| Ta10/NiCr60 | 1317 | 444 | ~3 |
| Ta10/NiCr40 | ~100 | ~100 | ~1 |
| Ta50/Ru20 | 2110 | 259 | ~8 |
| Ta20/Ru20 | 2257 | 227 | ~10 |
| Ta10/Ru10 | 2000 | 270 | ~7.5 | where Hc is the coercive field

It can be clearly seen that exchange bias properties such as Hex, Hex/Hc are significantly improved with Ta/Ru seed layers. Also the Ta/Ru seed layers can be thinned down to an exceptionally low value without sacrificing the exchange properties. By contrast, the Ta/NiCr seed layers cannot establish significant Hex once the NiCr thickness is less than about 45 Å.

Furthermore, when this ultra-thin Ta/Ru seed layer was used as part of a TMR stack, a truly outstanding TMR ratio, even at a very small R.A, was obtained; when compared with a Ta/NiCr seeded TMR film with a similar structure, the gain in MR ratio was about 40%, as listed in TABLE II:

TABLE II

| CONFIGURATION | R.A | dR/R |
| --- | --- | --- |
| Ta10/NiCr60/IrMn70/CoFe25%(19)/Ru7.5/CoFeB13/CoFe12.5/SL/Al4.5/NOX/Fe70%Co(10)/Ni90%Fe(40)/Ru10/Ta60/Ru30 | 1.2 | 12% |
| Ta20/Ru20/IrMn70/CoFe25%(19)/Ru7.5/CoFeB13/CoFe12.5/SL/Al4.5/NOX/Fe70%Co(I0)/Ni90%Fe(40)/Ru10/Ta60/Ru30 | 1.2 | 17% |

This represents a significant improvement over the state of the art. Prior to the deposition and oxidation of the 4.5 Å Al layer, there a surfactant layer (SL) which is used to provide a smoother and well-oxidized bottom interface for the AlOx barrier layer.

We also observed that with ultra-thin Ta/Ru seed layers, the AlOx barrier becomes much smoother than in the Ta/NiCr case. Additionally, the ultra-thin Ta/Ru seed layers lead to higher breakdown voltage, better high-state ratio and improved wafer MR ratio uniformity. All these improvements are derived from the improved barrier smoothness caused by ultra-thin Ta/Ru seed layers.

In the CCP-CPP case, this ultra-thin Ta/Ru seed layer also brings obvious advantages, not only in the much reduced film thickness but also in the much enhanced MR ratio. As shown TABLE III, a Ta10/Ru10 seeded CCP-CPP structure has been shown to have a large dR/R ratio of 11.4% for an R.A of 0.15 ohms-sq. microns.

TABLE III

| CONFIGURATION | R.A | dR/R |
| --- | --- | --- |
| Ta10/Ru10/IrMn70/CoFe8/Fe70%Co10/CoFe14/Ru7.5/Fe70%Co12/Cu2/Fe70%Cu12/AlCu8.5/RFPIT(20W50sccm34s)/RFIAO(27WAr/O=35/0.5640s)/Cu3/Fe70%Co12/CoFeB(10)/Ni95%Fe(50)/Ru10/Ta60/Ru30 | 0.15 | 11.43% |

In TABLE III above, Ta10/Ru10 serves as the seed layer, and IrMn is used as the antiferromagnetic pinning layer. In the synthetic AP structure, FCC-like trilayer CoFe8/Fe70% Co/CoFe14 is used as AP2 for better EM performance while the Fe70% Co laminated with Cu is used as the AP1 layer. AlCu is employed as the CCP-layer, and its oxide formation and segregated metal path is defined by the following RF-PIT, as 20 W 50 sccm for 34 sec, and RF-IAO processes, i.e. 27 W, $Ar/O_2$=35/0.56. Fe70% Co(12)/CoFeB(10)/Ni95% Fe(50) is the free layer and the Ru/Ta/Ru is applied as the capping layer.

In summary, the present invention offers the following advantages:

(a) Significant improvement in TMR ratio, especially at lower R.A.
(b) Improved AlOx barrier smoothness for better breakdown voltage, high-state ratio and wafer uniformity.
(c) Better exchange bias strength
(d) Thinner full film thickness, enabling a reduced shield-to-shield spacing for resolution improvement. The film thicknesses that are claimed for the Ta/Ru seed bilayer are critical for the success of the present invention.

While the thickness of the Ta and Ru layers may range from 5 to 30 Å, our preferred thicknesses have been 20 Å or less as this provides the best overall design. Such very thin seed layers had not been previously used because of the poor Hex values obtained when using materials such as NiCr. We note here that both the Ta and the Ru layers can be processed through sputtering using either Ar gas or Kr gas.

What is claimed is:

1. A process to manufacture a magnetic read head, comprising:
    providing a lower magnetic shield layer having an upper surface and then cleaning said upper surface;
    depositing a layer of tantalum, between about 5 and 20 Angstroms thick, on said cleaned surface;
    depositing a layer of Ru, between about 5 and 20 Angstroms thick, on said layer of tantalum whereby said tantalum and Ru layers together form a seed layer;
    depositing a layer of IrMn, between about 40 and 80 Angstroms thick, on said seed layer;
    on said IrMn layer, depositing an AP2 layer, whereby there is an exchange bias between said IrMn and AP2 layers;
    depositing a layer of AFM coupling material on said AP2 layer;
    depositing an AP1 layer on said layer of AFM coupling material;
    depositing a spacer layer on said AP1, said spacer layer being a non-magnetic conductor constrained to contact said free layer through pores in a nano-oxide layer, whereby said magnetic read head is a CCP CPP device having a GMR ratio of at least 10% with a R.A product of about 0.2 ohm.m$^2$;
    depositing a free layer on said spacer layer; and
    forming a capping layer on said free layer.

2. The process described in claim 1 wherein said exchange bias is at least 1,500 Oersted.

3. The process described in claim 1 wherein said read head has a shield-to-shield spacing that is no greater than about 0.05 microns, thereby facilitating improved resolution of said read head.

4. The process described in claim 1 wherein said spacer layer is a non-magnetic conductor whereby said magnetic read head is a CPP GMR device having a GMR ratio of at least 2%.

5. A process to manufacture a magnetic read head, comprising:
    providing a lower magnetic shield layer having an upper surface and then cleaning said upper surface;
    depositing a layer of tantalum, between about 5 and 20 Angstroms thick, on said cleaned surface;
    depositing a layer of Ru, between about 5 and 20 Angstroms thick, on said layer of tantalum whereby said tantalum and Ru layers together form a seed layer;
    depositing a layer of IrMn, between about 40 and 80 Angstroms thick, on said seed layer;
    on said IrMn layer, depositing an AP2 layer, whereby there is an exchange bias between said IrMn and AP2 layers;
    depositing a layer of AFM coupling material on said AP2 layer;
    depositing an AP1 layer on said layer of AFM coupling material;
    depositing a spacer layer on said AP1 layer, said spacer layer is being a dielectric layer whereby said magnetic read head is a TMR device having a TMR ratio of at least 15% with a R.A product of about 1.2 ohm.m$^2$;
    depositing a free layer on said spacer layer; and
    forming a capping layer on said free layer.

6. The process described in claim 5 wherein, when said TMR magnetic read head has a R.A product of 1.2 ohm.m$^2$ it also has a TMR ratio of at least 15%.

7. The process described in claim 5 wherein, when said dielectric layer is aluminum oxide, said read head has a TMR ratio of at least 15% and a breakdown voltage of at least 0.4 volts.

8. A magnetic read head, comprising:
    a lower shield layer on which is a seed layer that comprises a first layer, between about 5 and 10 Angstroms thick, that contacts a layer of tantalum, between about 5 and 10 Angstroms thick;
    a layer of IrMn, between about 40 and 80 Angstroms thick, on said seed layer;
    on said IrMn layer, an AP2 layer, there being an exchange bias between said IrMn and AP2 layers;
    a layer of AFM coupling material on said AP2 layer;
    an AP1 layer on said layer of AFM coupling material;
    a non-magnetic spacer layer on said AP1 layer, said spacer layer being a non-magnetic conductor constrained to contact said free layer through pores in a nano-oxide layer, whereby said magnetic read head is a CPP CCP device having a GMR ratio of at least 10% with a R.A product of about 0.2 ohm.m$^2$;
    a free layer on said non-magnetic spacer layer; and
    a capping layer on said free layer.

9. The magnetic read head described in claim 8 wherein said first layer, on which lies said IrMn layer, is Ru.

10. The magnetic read head described in claim 8 wherein said first layer, on which lies said IrMn layer, is selected from the group consisting of Cu, Ni, NiFe, CoFe, and Cr.

11. The magnetic read head described in claim 8 wherein said exchange bias is at least 1,500 Oersted.

12. The magnetic read head described in claim 8 wherein said read head has
    a shield-to-shield spacing that is no greater than about 0.05 microns.

13. The magnetic read head described in claim 8 wherein said spacer layer is a non-magnetic conductor whereby said magnetic read head is a CPP GMR device having a GMR ratio of at least 2%.

14. A magnetic read head, comprising:
    a lower shield layer on which is a seed layer that comprises a first layer, between about 5 and 10 Anastroms thick, that contacts a layer of tantalum, between about 5 and 10 Angstroms thick;

a layer of IrMn, between about 40 and 80 Angstroms thick, on said seed layer;

on said IrMn layer, an AP2 layer, there being an exchange bias between said IrMn and AP2 layers;

a layer of AFM coupling material on said AP2 layer;

an AP1 layer on said layer of AFM coupling material;

a non-magnetic spacer layer on said AP1 layer, said spacer layer being a dielectric layer whereby said magnetic read head is a TMR device having a TMR ratio of at least 15% with a R.A product less than 1.2 ohm.m$^2$;

a free layer on said non-magnetic spacer layer; and a capping layer on said free layer.

15. The magnetic read head described in claim 14 wherein, when said TMR magnetic read head has a R.A product of 1.2 ohm.m$^2$, it also has a TMR ratio of at least 15%.

16. The magnetic read head described in claim 14 wherein, when said dielectric layer is aluminum oxide, said read head has a TMR ratio of at least 15% and a breakdown voltage of at least 0.4 volts.

* * * * *